United States Patent

Pollock et al.

[11] Patent Number: 6,004,855
[45] Date of Patent: Dec. 21, 1999

[54] PROCESS FOR PRODUCING A HIGH PERFORMANCE BIPOLAR STRUCTURE

[75] Inventors: Larry Joseph Pollock; George William Brown, both of Santa Clara County, Calif.

[73] Assignee: Synergy Semiconductor Corporation, Santa Clara, Calif.

[21] Appl. No.: 08/967,322

[22] Filed: Oct. 29, 1997

Related U.S. Application Data

[63] Continuation of application No. 08/599,506, Jan. 25, 1996, abandoned, which is a continuation of application No. 08/271,233, Jul. 6, 1994, abandoned, which is a continuation of application No. 07/866,115, Apr. 7, 1992, abandoned, which is a continuation of application No. 07/582,822, Sep. 14, 1990, abandoned, which is a continuation of application No. 07/180,626, Apr. 11, 1988, abandoned.

[51] Int. Cl.$^6$ .................................................. H01L 21/331
[52] U.S. Cl. ......................... 438/342; 438/361; 438/366; 438/368
[58] Field of Search ..................................... 438/338, 342, 438/364, 365, 366, 368, 359, 361

[56] References Cited

U.S. PATENT DOCUMENTS

| | | | |
|---|---|---|---|
| 3,847,687 | 11/1974 | Davidsohn | 357/59 H |
| 4,125,426 | 11/1978 | Inayoshi | 437/162 |
| 4,188,707 | 2/1980 | Asano | 437/162 |
| 4,234,357 | 11/1980 | Scheppele | 437/162 |
| 4,238,278 | 12/1980 | Antipov | 437/72 |
| 4,381,953 | 5/1983 | Ho et al. | 357/59 H |
| 4,451,328 | 5/1984 | Dubois | 437/200 |
| 4,512,075 | 4/1985 | Vora | 437/162 |

(List continued on next page.)

FOREIGN PATENT DOCUMENTS

| | | |
|---|---|---|
| 192871 | 9/1986 | European Pat. Off. . |
| 193934 | 9/1986 | European Pat. Off. . |
| 200603 | 11/1986 | European Pat. Off. . |
| 253538 | 1/1988 | European Pat. Off. . |
| 0013760 | 1/1982 | Japan ..................................... 437/162 |
| 0061668 | 4/1983 | Japan ..................................... 437/162 |
| 2183093 | 5/1987 | United Kingdom . |

OTHER PUBLICATIONS

Fleming, D., et al., "Open–Collector Structure Lateral PNP Transistors", IBM Technical Disclosure Bulletin, vol. 19, No. 2, Jul. 1976, pp. 569–570.

Fleming, D.J., et al., "Open Collectorstwctor . . . ", IBM Technical Disclosure Bulletin, vol. 19, No. 2, Jul. 1976, pp. 569–570.

Fleming, D.J., et al., "Open Collector . . . " IBM Tech. Disc. Bull., 19(2), Jul. 1976, pp. 569–570.

*Primary Examiner*—T. N. Quach
*Attorney, Agent, or Firm*—Flehr Hohbach Test Albritton & Herbert LLP

[57] ABSTRACT

A process for producing a small shallow-depth high-performance bipolar structure having low parasitic capacitance is disclosed wherein an active base region of a P-type material is first defined in a substrate, a portion of which is of N-type material in a device formation area surrounded by an isolating oxide regions, such as trenches or the like. An N-doped polysilicon layer is then defined over the active base region and over field oxide regions located atop the isolating trenches. This N-poly region, when treated, will provide an interdigitated collector with self aligning emitter region aligned over the active base region. After appropriate spaced isolation layers are placed, a P-poly layer is laid down and heat treated to cause the P-type doping material to diffuse into the substrate contact to the active base region. A thin buried collector layer, approximately 1.5- to 2-micron thick, can be used as a result of the combination of an interdigitated collector design and a thin epitaxial region in which the active base is located; this combination contributing to a low effective collector resistance that compensates for the increased resistance associated with a thinner buried collector layer. The process provides for collector contacts in close proximity to the active device region permitting fabrication of a small device with very low parasitic capacitance.

25 Claims, 11 Drawing Sheets

U.S. PATENT DOCUMENTS

| | | | |
|---|---|---|---|
| 4,609,568 | 9/1986 | Koh et al. | 437/200 |
| 4,617,071 | 10/1986 | Vora | 437/200 |
| 4,669,180 | 6/1987 | Thomas | 437/31 |
| 4,686,762 | 8/1987 | Chai et al. | 437/162 |
| 4,704,368 | 11/1987 | Goth et al. | 437/60 |
| 4,705,599 | 11/1987 | Suda et al. | 437/33 |
| 4,729,965 | 3/1988 | Tamaki | 437/31 |
| 4,774,204 | 9/1988 | Havemann | 437/200 |

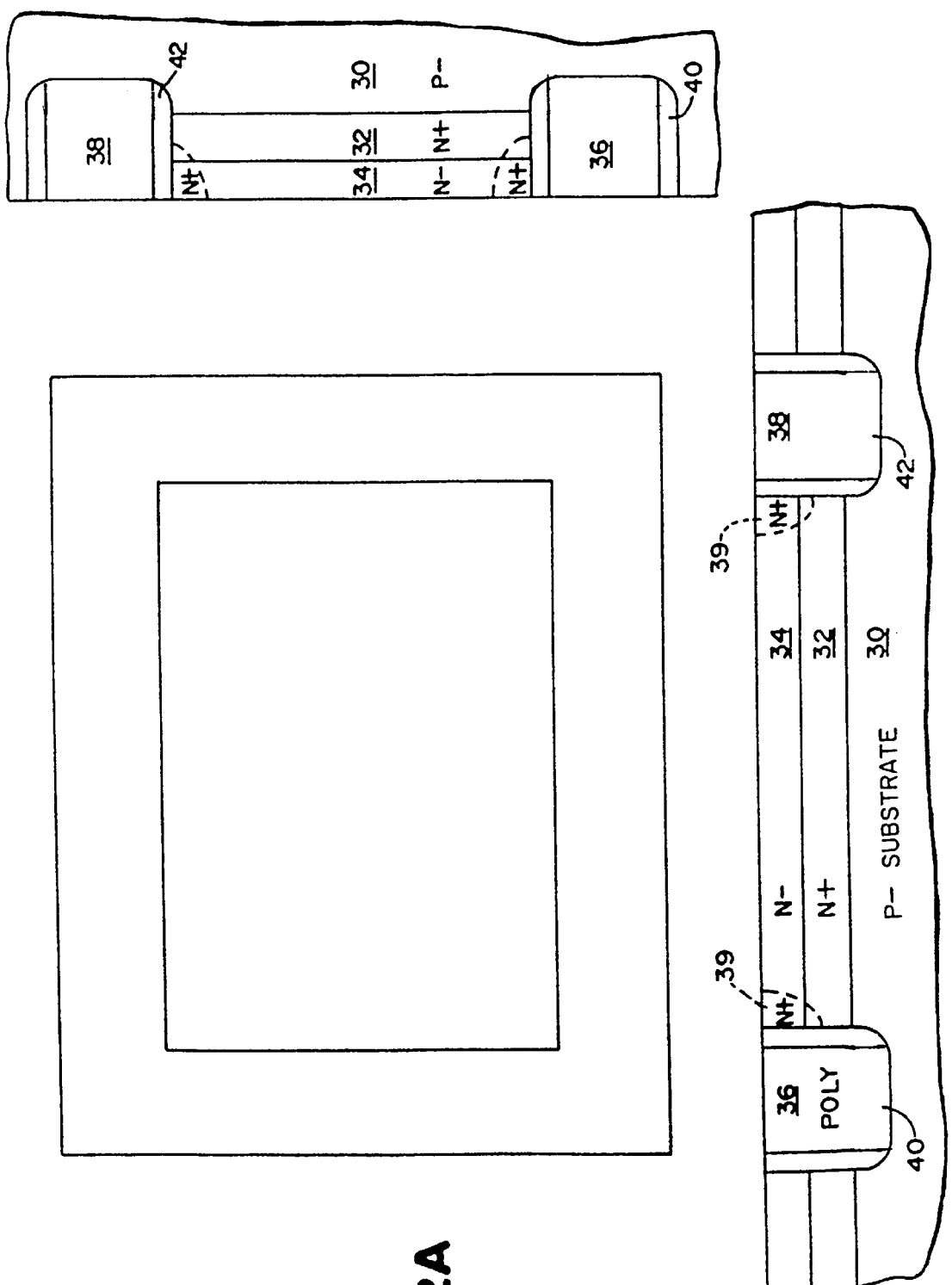

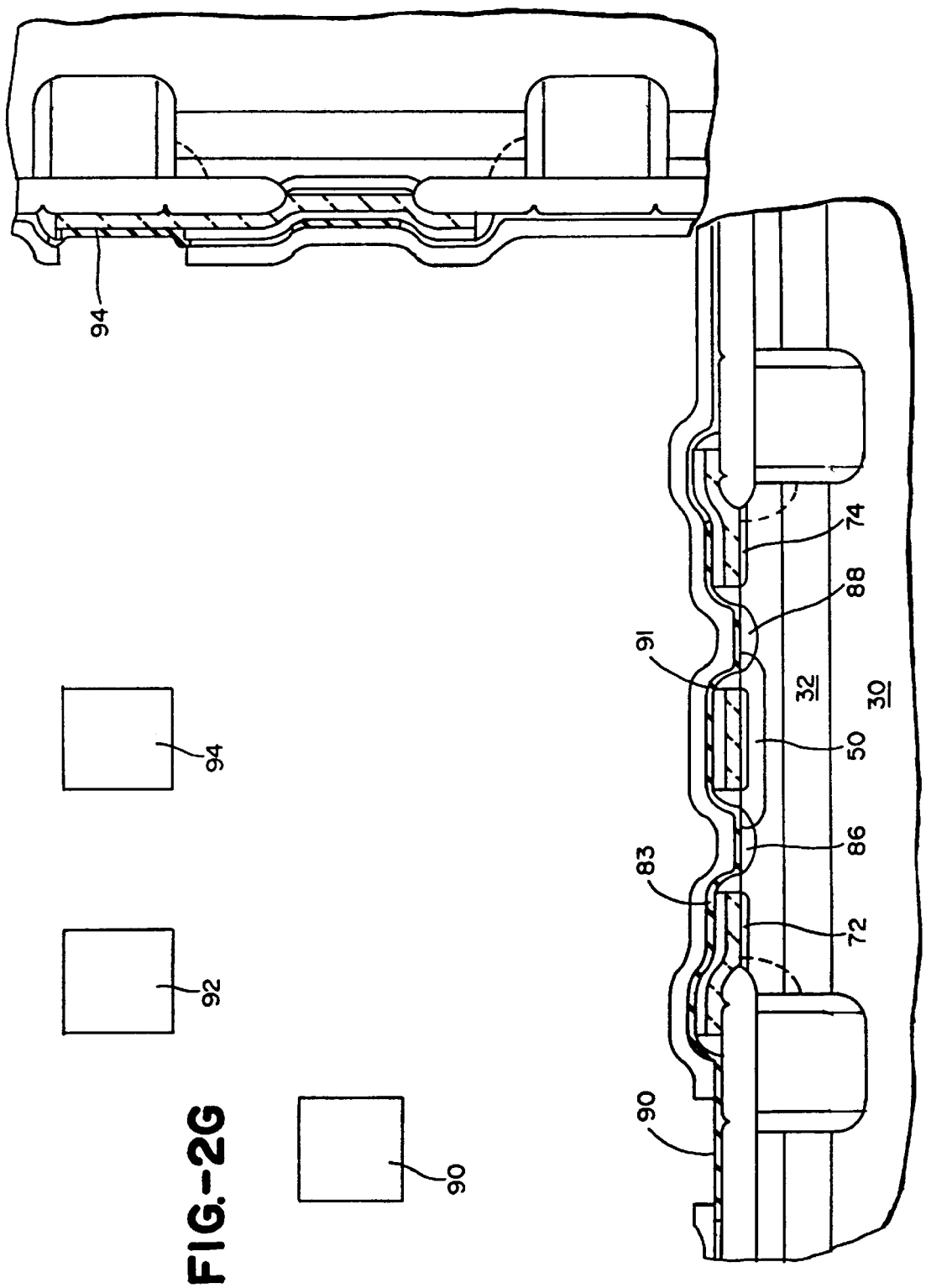

PROCESS FOR PRODUCING A HIGH PERFORMANCE BIPOLAR STRUCTURE

CROSS-REFERENCE TO RELATED APPLICATION

The present application is a continuation of Ser. No. 08/599,506 (filed Jan. 25, 1996 and now abandoned), which was a continuation of Ser. No. 08/271,233 (filed Jul. 6, 1994, and now abandoned), which was a continuation of Ser. No. 07/866,115 (filed Apr. 7, 1992, and now abandoned), which was a continuation of Ser. No. 07/582,822 (filed Sep. 14, 1990, and now abandoned), which application was a continuation of Ser. No. 07/180,626 (filed Apr. 11, 1988, and now abandoned).

FIELD OF THE INVENTION

This invention relates to a method for fabricating high-performance bipolar integrated circuits, the resulting circuits occupying a minimum horizontal area and with minimum junction depth.

BACKGROUND OF THE INVENTION

The present trend in semiconductor technology is toward large scale integration of devices with very high speed and low power performance. The parameters that are essential to such high performance bipolar transistors include the presence of low parasitic capacitances as realized by shallow vertical junctions, and small horizontal geometries. In other words, it is necessary to make the devices in the integrated circuits as small as possible in both the horizontal and vertical directions.

With advances in semiconductor processing technology such as in the fields of ion implantation, dielectric isolation, electron beam and X-ray lithography and the like, fabrication of ultra high performance integrated circuit devices can be achieved. In other process technologies, fabrication of high performance integrated circuit devices has been improved.

One approach developed to reduce the size of integrated circuits has been the use of trench or slot isolation to isolate adjacent bipolar structures. Because this technique incorporates etching grooves into the semiconductor wafers adjacent to those regions in which PN junctions are to be formed, it becomes increasingly important to make the device as shallow possible in order to minimize the depth to which the groove must be etched.

The Texas Instruments process illustrated in FIG. 1 is typical of advanced bipolar processes as presently executed. As can be seen, it includes an outboard collector 10 which is isolated by field oxide 12 from the remainder of the device, thereby extending the horizontal region of the integrated circuit occupied by each NPN transistor. Similar efforts have been made by IBM as disclosed in U.S. Pat. Nos. 4,392,149 4,319,932 and 4,338,138. All of these patents are characterized by a resulting structure including a remote collector. They are also characterized by a relatively deep structure to incorporate the buried layer, which is necessary to get a low sheet resistance in the buried layer. This deep buried layer results in the need for providing a trench or slot or a deep isolation with the oxide isolation negative results discussed above.

Use of a separate collector also requires providing a separate island in the oxide to make connection to this collector. Use of a remote collector also requires provision of a relatively thick buried layer to provide the desired low resistance between emitter and collector. It should be noted that in prior art structures, to achieve a low sheet resistivity for the buried layer requires that the buried layer be about 3 microns thick. Formation of the buried layer further requires considerable heat cycling and heavy doping, all of which introduces stresses into the finished structure, and results in a relatively deep structure. Additionally, putting down the P-poly first requires that the area which is to become the active emitter be subjected to the etch processing required to open this P-poly for the N-poly emitter which comes later. This potentially subjects the single crystal silicon in the active emitter to etch damage which can induce emitter defects. Another difficulty that follows from the use of processes of the type appearing in FIG. 1 is that in order to obtain minimum a geometry structure, the emitter 14 is self-aligned with the active base 16. However, this requires that the P-poly layer 18 has to make contact to the active base 16 by diffusing the extrinsic base regions 20 under the oxide spacers 22 which separate the N-poly layer 24 and the P-poly layer 18. This requires significant heat treatment of the extrinsic base regions 20 and the intrinsic base regions and this extra heat treatment makes the intrinsic base regions 16 relatively deep. The provision of deep extrinsic base regions reduces the ability to obtain shallow junctions which is one of the objectives of this process design. Further, if the collector 10 were moved to be more closely adjacent to the base region, very high collector base capacitance, and relatively low breakdown voltages would result. Therefore, the processes disclosed in the prior art are relatively difficult to control in terms of achieving the process objectives of optimizing shallow junctions, minimum device area, low defects and low parasitic capacitances, with the highest performance possible.

SUMMARY OF THE INVENTION

It is an object of this invention to provide an improved method of making small geometry bipolar devices within a given masking or lithographic capability.

Another objective herein is to provide methods of making bipolar devices that will exhibit reduced collector base junction capacitance.

Another objective is to provide a process for producing devices that will have greatly reduced collector-substrate junction capacitance.

Another objective is to provide a process for producing devices that have greatly reduced parasitic collector resistance.

Yet another objective is to provide a process for fabricating bipolar devices that is simple and precise, provides good yield, and results in shallow devices with improved characteristics that are easier to process.

A related objective of this invention is to provide a process for producing bipolar devices that will have both an implanted base and shallow junctions in order to minimize parasitic capacitance.

A further objective of this device structure is to protect the active emitter area from harsh etches during processing and thus reduce defects in this sensitive area.

A further objective is to provide a process for producing bipolar devices that work well with the formation of CMOS devices in a BICMOS process.

According to the present invention, small geometry bipolar devices are fabricated using the following successive steps:

(a) forming on a semiconductor substrate of P-type material a layer of N+-type material, over which layer is formed an epitaxial layer of N-type material, whereby said layer of N+-type material becomes a buried layer;

(b) forming an isolation trench and an adjacent sinker region in the structure resulting from step (a), in which the isolation trench extends through the epitaxial layer, the buried layer, and into said substrate, and at least a peripheral portion of the sinker region provides a low resistance current path from adjacent an upper surface of said epitaxial layer to said buried layer, the region bounded by said trench defining an isolated region in which the bipolar transistor is to be fabricated;

(c) forming a thin oxide layer on at least walls of said trench formed in step (b);

(d) filling said trench with polysilicon;

(e) forming an oxide layer over a surface of said substrate without forming said oxide layer over areas of said surface of said substrate in which an active portion of said bipolar transistor will be formed;

(f) forming a P-type active base region in said epitaxial layer within said isolated region;

(g) forming an emitter contact, and a collector contact on a structure resulting from step (f), comprising the steps of:

(i) forming on the entire epitaxial layer a layer of polysilicon doped with N-type dopant, and forming a protective oxide layer over said polysilicon layer;

(ii) patterning said N-type polysilicon layer and said oxide layer, said patterning defining an emitter region within said active base region and an emitter contact, said emitter contact overlying at least a portion of said active base region, and defining a separate collector contact outside said active base region, on said epitaxial layer, overlying at least a portion of said sinker region, said patterning forming vertical sidewalls in said doped polysilicon layer and said oxide layer;

(h) depositing an oxide layer over a structure resulting from step (g) and performing an anisotropic etch on this oxide layer, thereby forming oxide sidewall spacers on said isolated region, adjoining said vertical sidewalls in said doped polysilicon layer whereby a portion of said isolated region is left exposed;

(i) heating a structure resulting from step (h) thereby forming an emitter region and a collector contact region by diffusion of said N-type dopant from said polysilicon into said epitaxial layer thereby forming an emitter region having a depth, and thereby forming a collector contact region;

(j) depositing a further layer of polysilicon doped with P-type dopant over said oxide layer and in contact with said exposed portion of said isolated region;

(k) heating a structure resulting from step (j) to diffuse said P-type dopant from said further layer of polysilicon into said portion of said isolated region exposed during anisotropic etching in step (h), thereby forming an extrinsic base region adjacent said active base region;

whereby said sidewall spacers have a lateral dimension that defines a lateral separation of said collector contact region and said extrinsic base region of said bipolar transistor and said sidewall spacers and said oxide layer provide electrical insulation between said further layer of polysilicon doped with said N-type dopant and said further layer of polysilicon doped with said P-type dopant.

More preferably, the bipolar transistor is fabricated without a field oxide layer within the expitaxial layer separating the collector contact and base region. The absence of such a field oxide layer contributes substantially to the desired small geometry. Method step (b) above can include etching a preliminary trench extending down into the buried layer but not into the substrate, and diffusing the preliminary trench with the N-type dopant thereby forming the N-type sinker region, which region extends into the buried layer and into the epitaxial layer adjacent the trench, and etching the preliminary trench through its bottom into the substrate thereby forming the trench, and edging the trench with oxide and filling the trench with a deposition of polysilicon that is then planarized. If desired, method step (b) can include a preliminary step of forming a mask through which the active base region is implanted with boron. According to the present invention, the buried layer has a thickness of about 1 $\mu$m, and the epitaxial layer has a thickness of about 0.75 $\mu$m. If desired, the bipolar transistor may include two collector contacts, in which case step (b) above will include forming an N-type sinker region for each of the collector contacts. The sidewall spacers may be formed with a lateral dimension of about 0.25 $\mu$m.

Fabrication time can be reduced at process step (g), above, by simultaneously forming the emitter and collector contacts on the isolated region. Further, at process step (g)(i) above, doping of the polysilicon layer can be carried as the polysilicon layer is formed or after the polysilicon layer is formed. The extrinsic base may be formed to a depth less than the depth of the active base region. Method step (j) above may include forming a layer of silicide on at least a portion of the further layer of polysilicon to reduce ohmic resistance thereon. If desired, method step (j) above may include masking a portion of the further layer of polysilicon, and forming a layer of silicide on at least a portion of the further layer of silicide, the result being that a portion of the further layer of polysilicon thus masked will have no silicide formed thereon and will define a resistor.

As seen, the present invention can provide a device with low collector resistance, whose sheet resistance can be raised by making the buried collector shallower. The net result of the combination of a thin epi and collector region is a relatively thin device that can be isolated from adjacent devices by a very shallow slot or trench on the order of about ½ to ⅔ of what is needed in prior art devices where lower sheet resistance buried layers are used.

The present structure using a shallow double collector incorporates comparable collector resistance and a shallower buried layer than the prior art. Use of a shallow epi layer in conjunction with a shallower buried collector makes the formation of this epi layer easier to control to a very high degree. Use of this thin epi layer also makes the devices easier to manufacture and less prone to defects. Since the device can be shallower, the isolation depth can be proportionally less, regardless of whether it is fully oxide isolated or trench isolated. The necessity for only a shallow isolation puts less stress on th silicon and takes less process time for formation. Further, the equipment necessary to cut trenches is very expensive, and the time to cut a typical 6 micron trench is up to two times as long as the approximately 3 to 4 micron trench of this invention. Another advantage of this device is that an active base is first diffused, after which the collector and emitter are simultaneously defined, a masking tolerance is created between the collector and emitter such that even though they are closely spaced, a very high breakdown voltage is created. Further, very little heat treatment after placement of the field oxide is necessary, and shallow junctions can also be used. Finally, it is relatively easy to incorporate an implanted rather than a diffused base in the process of the present invention, and the steps and sequences of this process works extremely well in the formation of combination bipolar CMOS (BICMOS) devices.

The objects, features and advantages of this invention will be better understood from the following description taken in conjunction with the accompanying drawings.

BRIEF DESCRIPTION OF THE DRAWINGS

FIG. 3 illustrates a P-type resistor as is possible in this technology.

DETAILED DESCRIPTION OF THE PREFERRED EMBODIMENT

Figure 1:
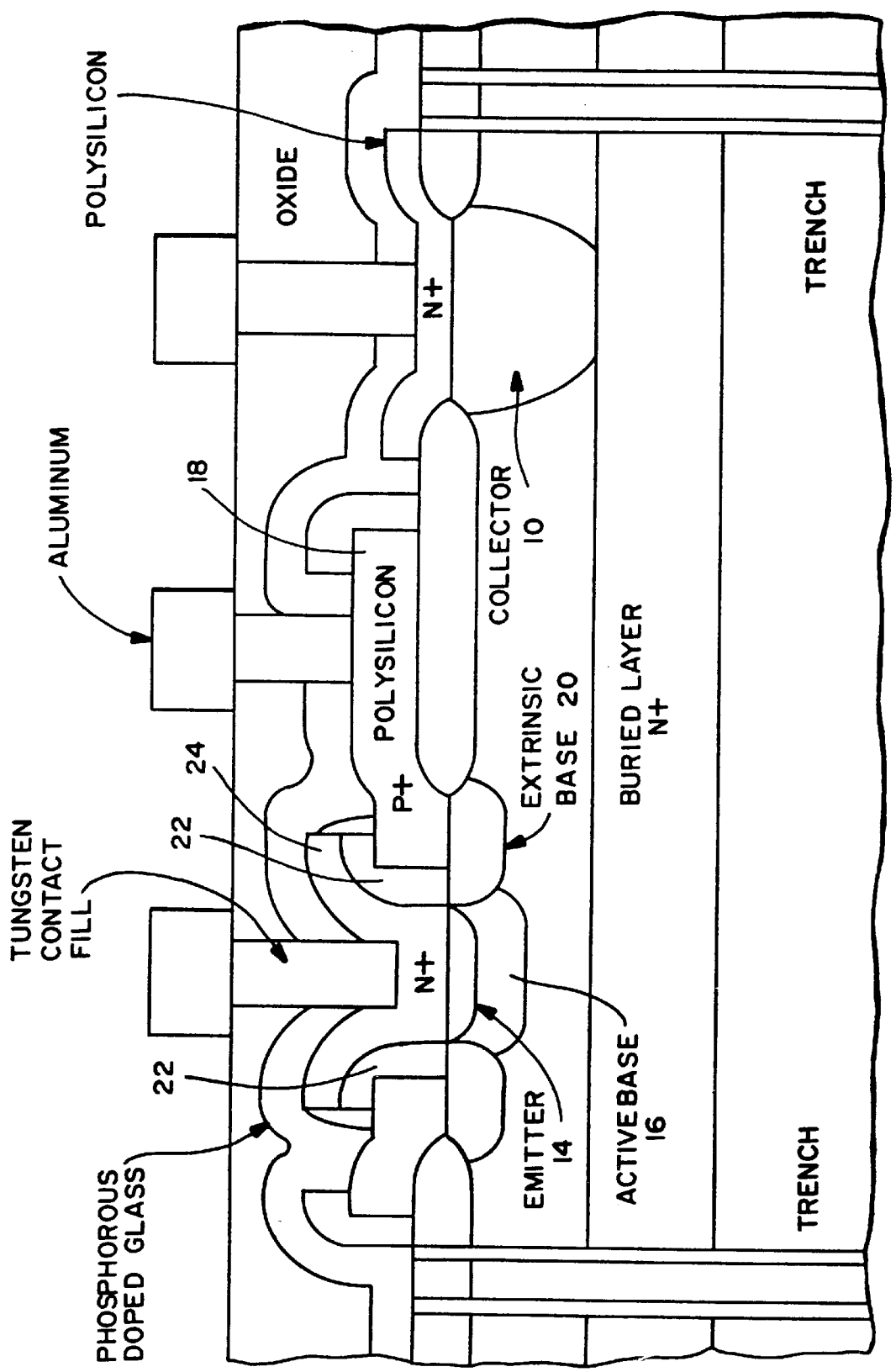
FIG. 1 illustrates a prior art process used to create relatively small geometry devices.

The process described below is suitable for producing high performance bipolar devices wherein all the elements are separated by spacers in order to minimize the size of the device as well as parasitic capacitance in the device. It should be noted that FIGS. 2A–2H combine three views of the layout of the device. The center section shows the mask being used to carry out this process. Below that is a vertical cross-section of the structure which is produced as a result of that masking step, and to the right is a vertical cross-section of the same structure taken at a 90° angle to the lower vertical section. Therefore, a complete sectional elevation view of the device is provided by the figures.

The process begins with a P-type substrate 30 as shown in FIG. 2A of 7–10 Ω centimeter resistivity. Then an unmasked sheet buried layer 32 of N-type doping material is formed using arsenic or antimony as the dopant. This buried layer 32, according to the present process, need only be about 1 micron thick. Because of the use of an interdigitated collector structure in the finished product, a very thin and thus very controllable buried layer is defined. This would imply that the process could in fact be started with preprocessed wafers that have this P-substrate 30 and the N-doped buried layer 32 which has a resistivity of about 100 Ω per square.

The next layer, also an unmasked layer, is the epi layer 34 which will be an N-doped layer and approximately ¾ micron thick. Up through this process step, the wafer could be stored in batch form because a specific device is not defined until after the buried collector is formed and the epitaxial layer is grown.

After oxidizing the surface of the wafer, the first masking step is carried out to form the trenches 36, 38; these trenches, edged with oxide as shown at 40, 42, and filled with poly as shown at 36, 38, will define the complete, isolated region in which an active NPN transistor will be defined.

An opaque field mask is used to define the boundaries of a trench that will surround each bipolar transistor on the wafer. A two-step etching process is used to form the trench 36, 38: the first etch defines a trench down into the buried layer (collector) but not into the substrate; next, an N+ doping along the trench creates an N+ region 39, shown by the dashed lines in FIG. 2, which will later provide a low resistance current path to the buried layer (collector) 32 from the collector contact which is to be defined in a later step.

The N+ dopant is diffused from the side of the trench 36, 38 into the monocrystalline epitaxy 34 and buried layer 32 beneath the mask; the second etching step involves etching of the trench through the buried collector and into the substrate.

The entire wafer is oxidized, including the sidewalls of the trench 36, 38. The oxide at the bottom of the trench is etched, the entire wafer is covered with a deposition of polysilicon (which also fills in the trench at 40, 42), and the entire surface is then planarized. The formation of the trench and its oxide sidewalls 40, 42 provides complete electrical isolation between adjacent transistors of the circuit and filling the trench with polysilicon helps to smooth the surface of the device by filling the void formed by the trench with polysilicon.

Figure 2B:
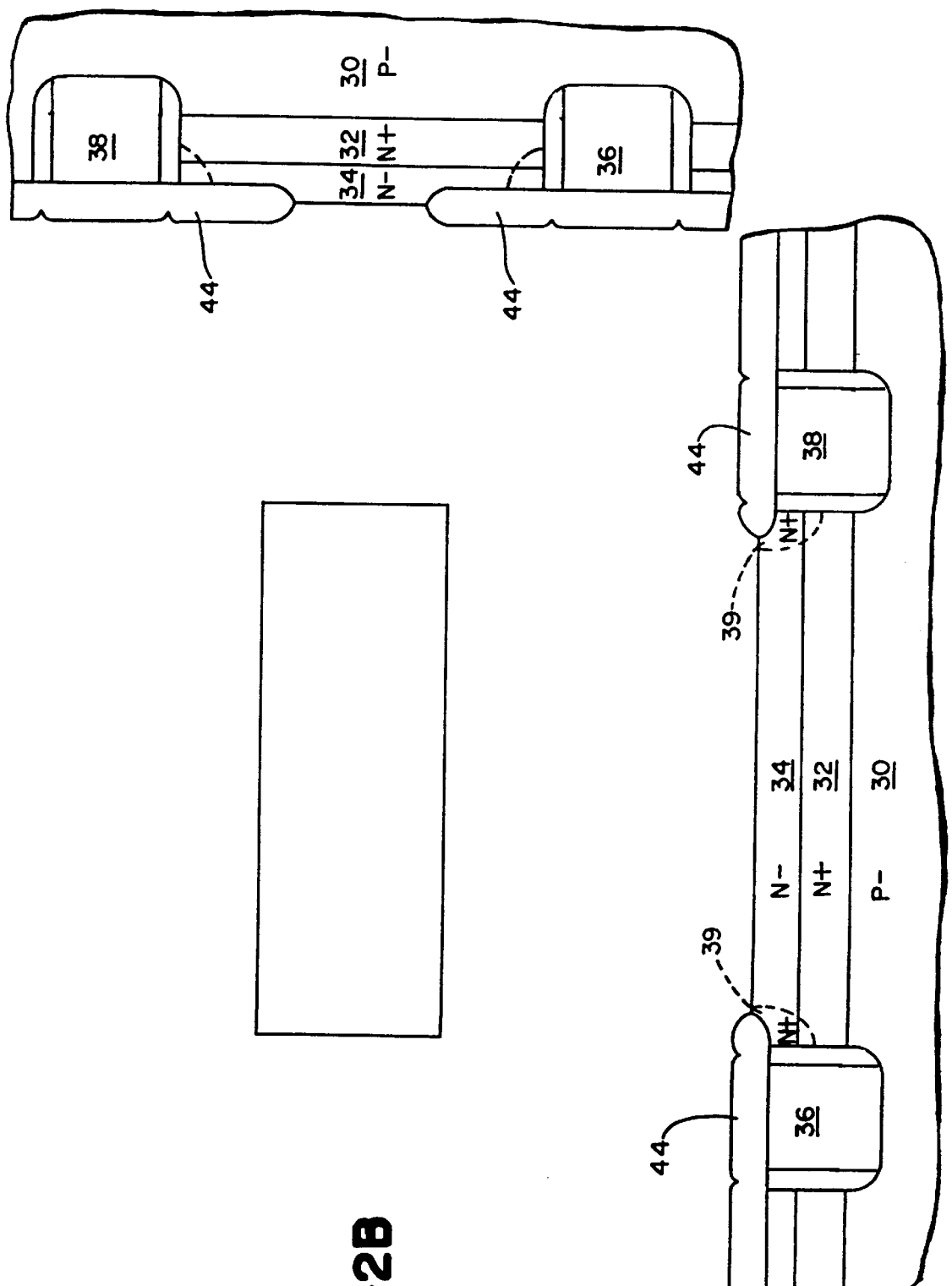
FIGS. 2A–2G illustrate the sequence used in carrying out the steps in the present invention.

Turning to FIG. 2B, the next mask is used to define the extent of the field oxide 44 which will surround the active device and further isolate the device from adjoining devices as well as providing an isolating support layer for some of the connections to be formed. Generally, the field oxide is grown over the trenches to electrically insulate the polysilicon trench fill. The nitride layer, whose extent is defined by the mask, prevents oxidation of the region where the active device is to be located.

The field oxide generally protrudes into the sinker, shown by the pointed regions, which are referred to in the industry as "bird beaks." The pointed regions in the field oxide are the result of the presence of the oxide layer along the trench 36, 38 sidewalls between the polycrystalline and monocrystalline silicon areas which does not have excess free silicon to donate to the thermally grown field oxide reaction. The nitride defining the active areas is then removed.

Figure 2C:
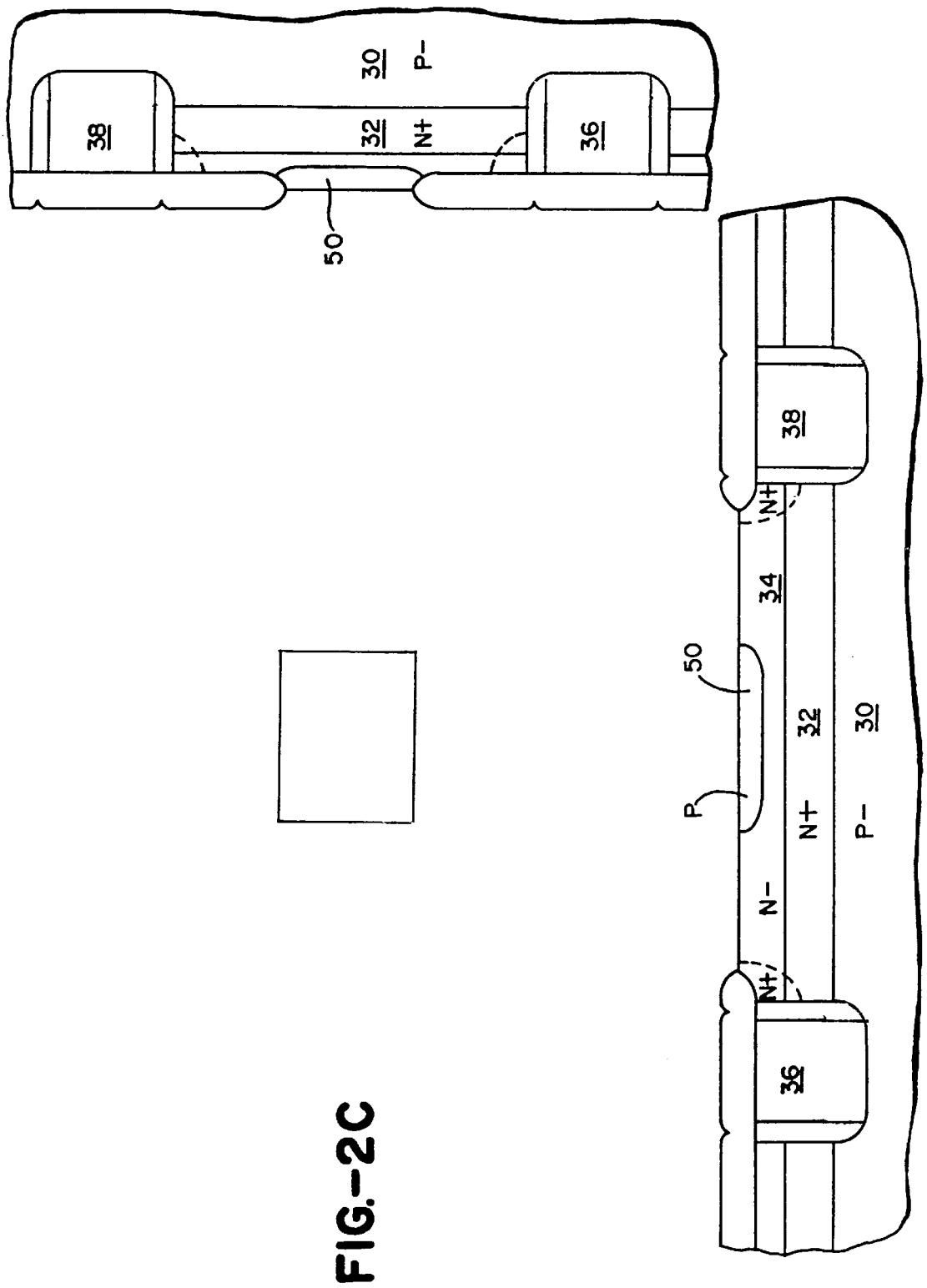

The next step is to define the intrinsic or active base region 50 as shown in FIG. 2C. The mask defines an area in the epitaxial layer into which the boron dopant (for a P-type base) will be implanted to form the active base, shown in FIG. 2C as the P-region 50. The slope of the sides of the P-region is due to side diffusion of dopant during subsequent heat processing.

Figure 2D:
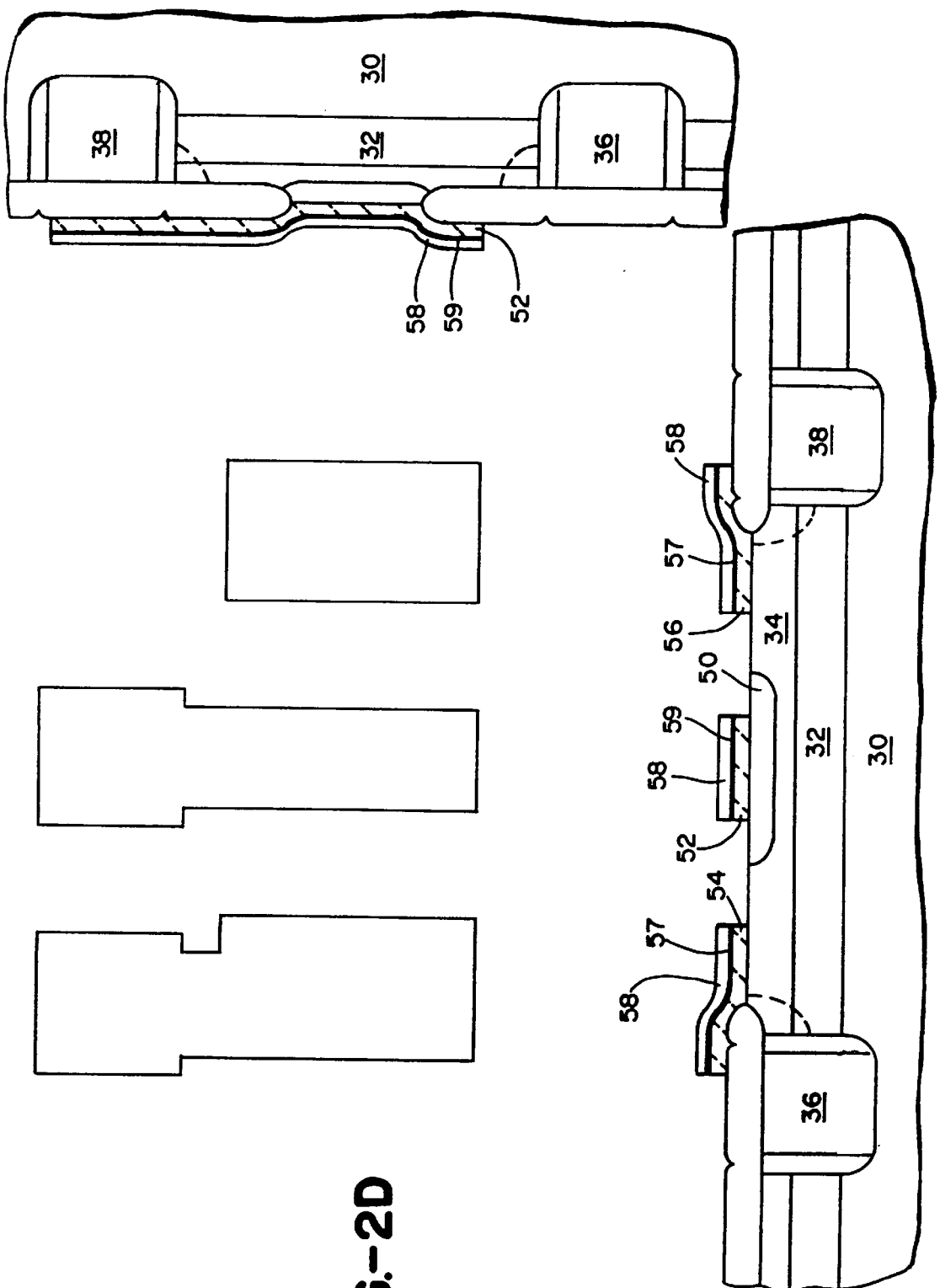

The next step, illustrated in FIG. 2D, is to simultaneously form the polysilicon emitter and collector contacts 52, 54, 56 aligned with the base 50. In the preferred embodiment, the polysilicon emitter 52 is deposited over the active base 50 and doped with an N-type doping material. In a preferred embodiment, two additional regions 54, 56 of the same N-type poly material are simultaneously formed. These will eventually be used to form the interdigitated collector contact regions of the present transistor device. Specifically, the mask shown in FIG. 2D is used to define the area of the active region where the emitter and the double collector are to be formed. A polysilicon layer (Poly I) is first deposited over the entire wafer. The polysilicon is then doped with an N+ dopant. N+ poly can be doped as it is deposited (in situ) implanted or deposited as a deposition after the poly is deposited.

After the emitter and collector contacts 52, 54, 56 are in place, titanium or tungsten is sputtered on, and a thin silicide layer 57, 59 is formed over the collector and emitter contacts. Then an oxide is deposited 58 over the entire surface formed to date. The objective is to provide a sandwich of oxide, silicide and poly sitting over the regions to be defined as the emitter and collector regions of the NPN transistor. Using the mask of FIG. 2D, the oxide, silicide and Poly I in all but the areas comprising the emitter, collector and their respective contacts are etched away, leaving the Poly I emitter and double collector contact elements shown in cross hatches of FIG. 2D which are covered with silicide and oxide.

Figure 2E:
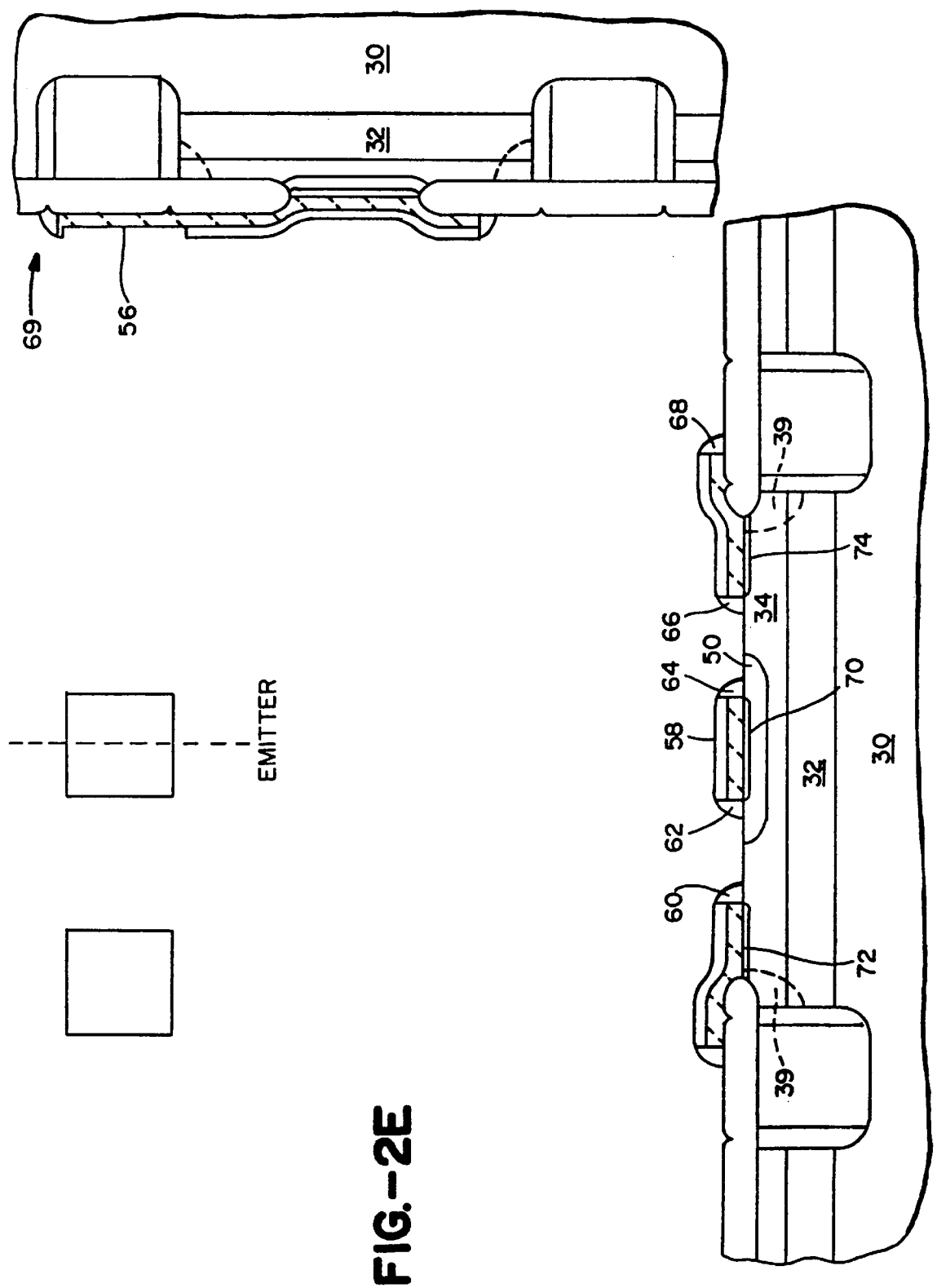

The next step is to define the spacers 60, 62, 64, 66, 68 which will separate the emitter and collector diffusions in the present device. The spacers are formed by depositing an oxide layer over the present device and then, as illustrated in FIG. 2E, performing an anisotropic etch on this oxide. This removes the oxide down to the epi region and the previously defined oxide 58 of FIG. 2C, and leaves the oxide along the vertical side walls of the collector and emitter contact regions and the separating spacers of the oxide layer 60, 62, 64, 66 and 68.

The spacer circled in the cross-section on the right-hand side has a step 69. This is the result of forming the spacers before the step of etching to form contact pads as shown in FIG. 2E. The present process may be modified to first etch the contact pads in the oxide 58 before forming the spacers or defining the emitter and collector pattern outlined in the steps above. This eliminates the step in the spacer and forms a spacer along the poly edge only and not the poly plus oxide.

Note that the heating used to carry out the oxide growth steps as well as limited additional heat treatment diffuses the emitter region 70 and collector region 72, 74 into the epi layer 34 using the N+ poly region as the source of N+ dopant. It can be seen that the diffused emitter region 70 is included within the active base region 50 and is well separated from the collector region 72, 74 by the epi 34.

FIG. 2E also illustrates a method that will be used in the present invention to make contact to the first poly layer 56 specifically by etching through the oxide layer during the anisotropic step described below down to the top of the poly layer 56 so that contact can be made to this poly layer for the purpose of providing an emitter contact. It should be noted from the design of the mask that even though the right hand cross-section shows only the contact to one layer, this step of etching through the oxide to the first poly layer 56 can be used to open a window for a contact both to the emitter 70 and one end of the inter-digitated collector 72. Specifically, the contact I mask of FIG. 2E defines the regions of the oxide coating over the poly of the emitter and collector contacts that will be etched away to expose the Poly I. As noted in the above paragraph (construction of spacers), the oxide in the contacts defined by the contact I mask of FIG. 2D can be removed prior to the Poly I mask and etch step of FIG. 2D with the elimination of the oxide step which is circled in the right-hand cross section of FIG. 2E. Note in the bottom cross-section of FIG. 2E that the base region 50 extends beyond the edges of the active emitter 70 on both sides. Note also a very thin layer underneath each of the emitter 70 and collector 72, 74 that resulted from the N-type dopant in the Poly I diffusing into the epitaxy. This diffused area actually defines the active collector and emitter contacts and the active emitter region. This diffusion reduces emitter and collector contact resistance and helps to make collector contact with the buried layer (collector) by way of the sinker 39.

Figure 2F:
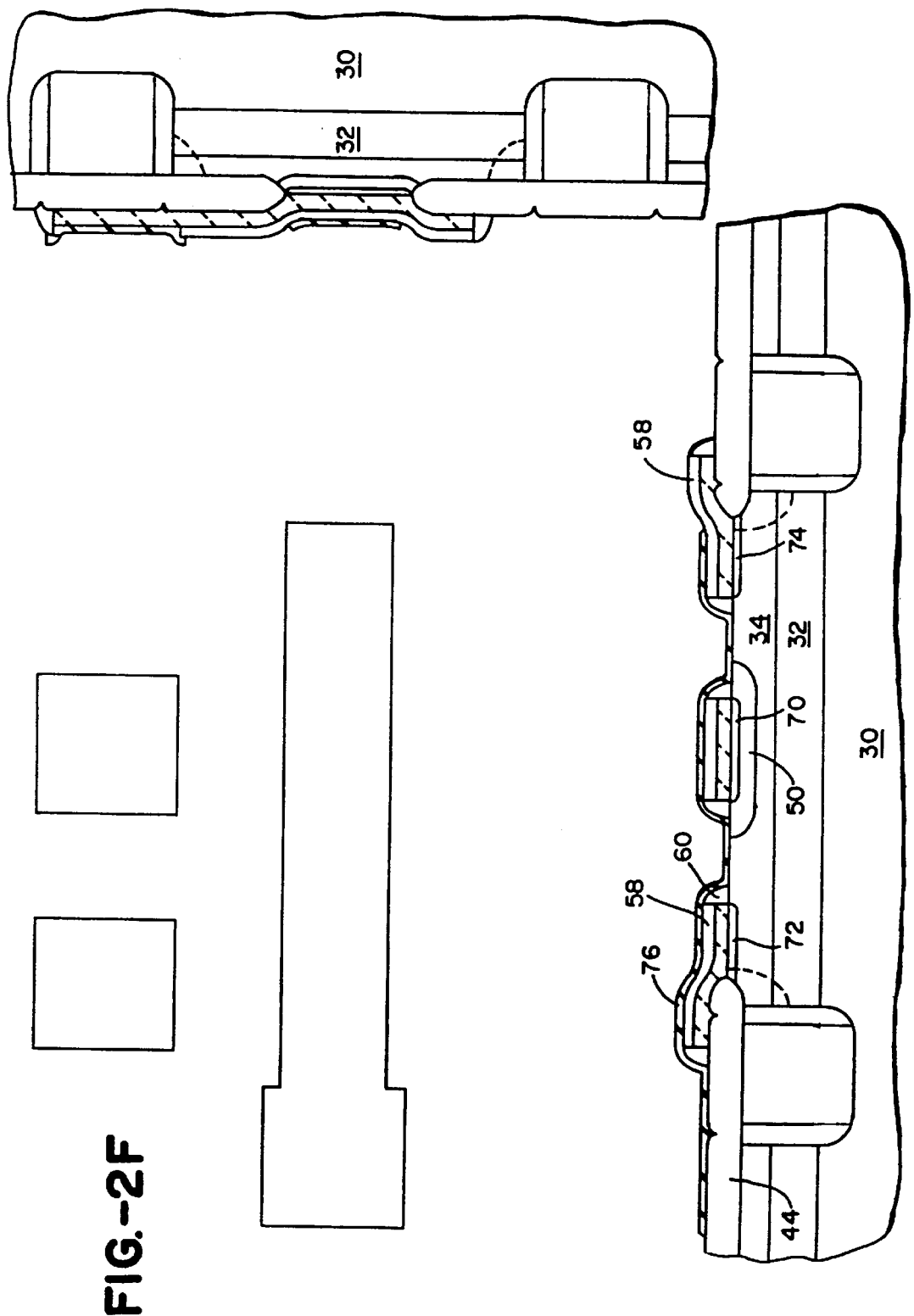

The next step shown in FIG. 2F is to lay down the second layer of poly which is the P-doped poly deposition. This layer of poly 76 passes over the oxide layer that covers the collector 58 and steps down over the spacer oxide 60, into the region of the collector epi 34 to contact the underlying base silicon layer 50, passes over the oxide that covers the emitter 70 and again steps down to the underlying silicon base 50 and then passes over the top of the other collector oxide region 58. This region, as it will be a conductive region, is brought out over to one side of the interdigitated collector and terminates over the field oxide 82. It should be noted that the windows in the mask shown in FIG. 2F are aligned with and slightly larger than the windows in the mask shown in FIG. 2E. This size relationship is used to achieve a stepped via between the first 57, 58 and second 83 layers of poly. Specifically, to define the polysilicon islands and interconnects, the second layer of polysilicon is deposited over the entire surface and implanted with P-dopant ($BF_2$). The entire surface is then covered with a nitride and a mask is defined which will leave nitride only over the conductive Poly II which will serve as contacts to the base region and to the emitter and collector electrodes, the resistor bodies and to local interconnect. Using the nitride to mask the Poly II, the Poly II outside this nitride is removed (without overetch).

The area outside the nitride is then oxidized, converting any remaining P-doped poly to insulating oxide while forming an insulating oxide cap along the Poly II edge.

The masking step shown in FIG. 2G will provide for the formation of the base collector and emitter contact 90, 92, 94 down to the appropriate layers of poly. The connections between the P-doped poly layer 83 and the active base region 50 will be provided by heat treating the doped poly layer which will cause the P-type doping material in the poly to diffuse into the underlying substrate 34, creating the extrinsic base regions 86, 88 which provide contact between this P-type poly material and the active intrinsic base 50. It is possible to add an extra step to this process to form a poly resistor simply by masking the P-poly layer prior to the silicide step which must follow the depositing of the P-poly layer. FIG. 3A illustrates the formation of the P-poly resistor. Without this masking step all of the P-poly is silicided. With the masking step, where the silicide is not formed, a resistor can be defined to be in series with one of the contacts as shown in FIG. 3. That is, the doped Poly II is a conductor but it has a much higher resistance (approximately 500 ohms per square) than regions of Poly II covered with the silicide (approximately 1–2 ohms per square). By carefully controlling the length and sheet resistivity and cross-sectional area of the doped regions, the process defines resistors 96 by leaving nitride over the active resistors (with the resistor mask), while siliciding 97 the remaining Poly II 98 outside the resistor mask (FIG. 3).

Figure 2H:
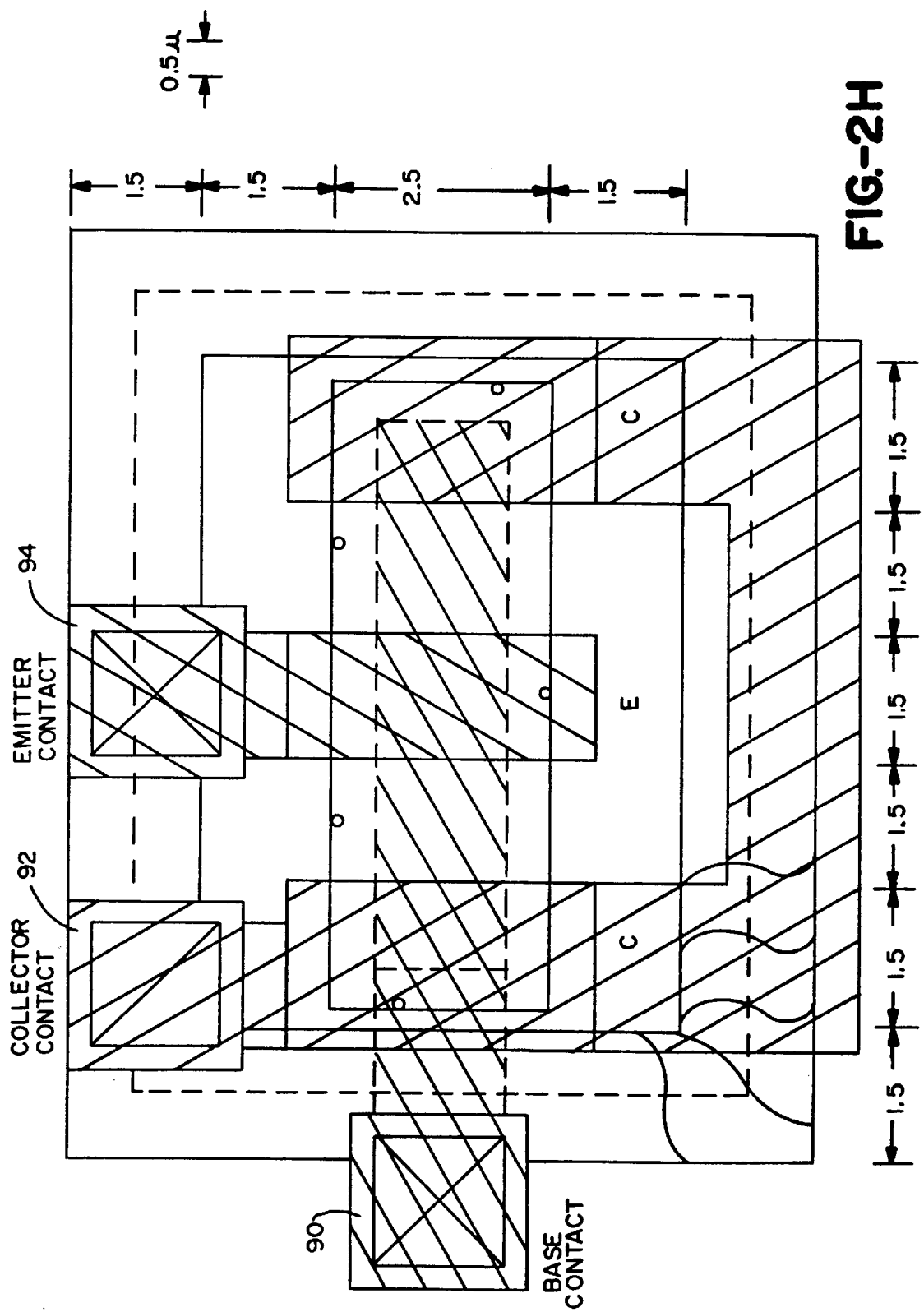
FIG. 2H illustrates a finished NPN device as viewed topologically.
Figure 2I:
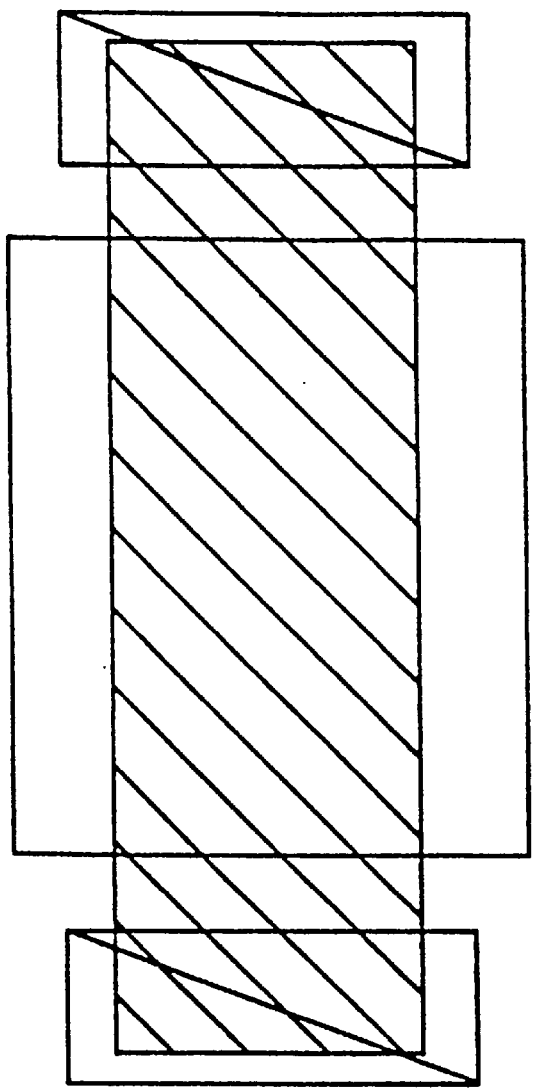
Figure 2I:
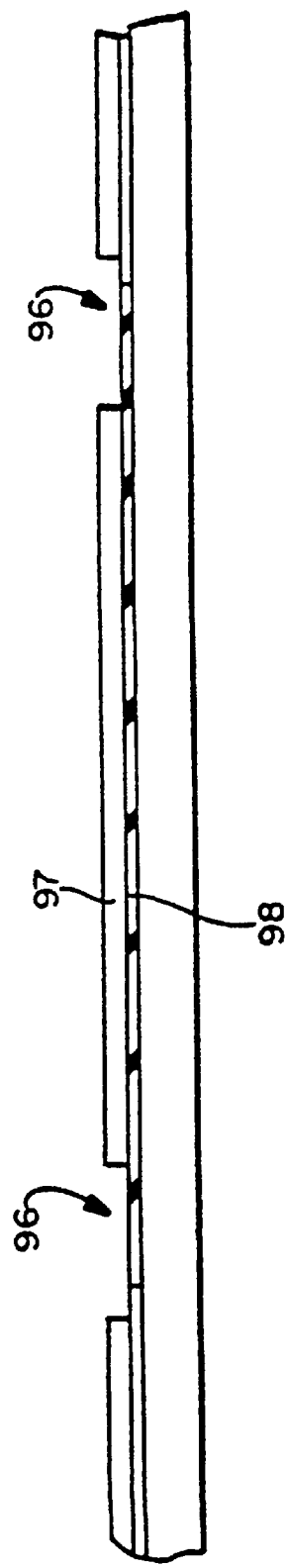
Figure 2J:
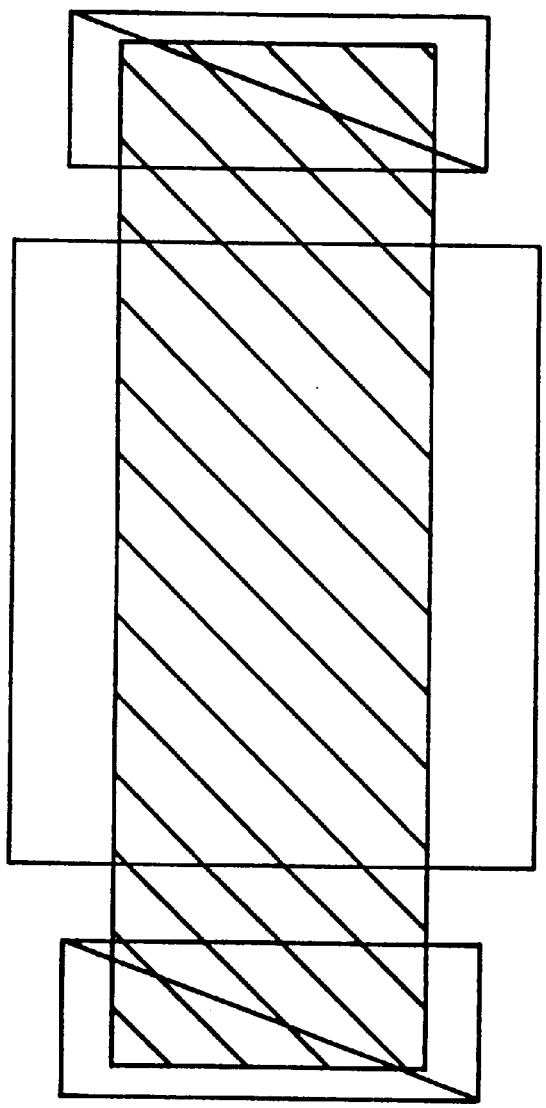
Figure 2J:
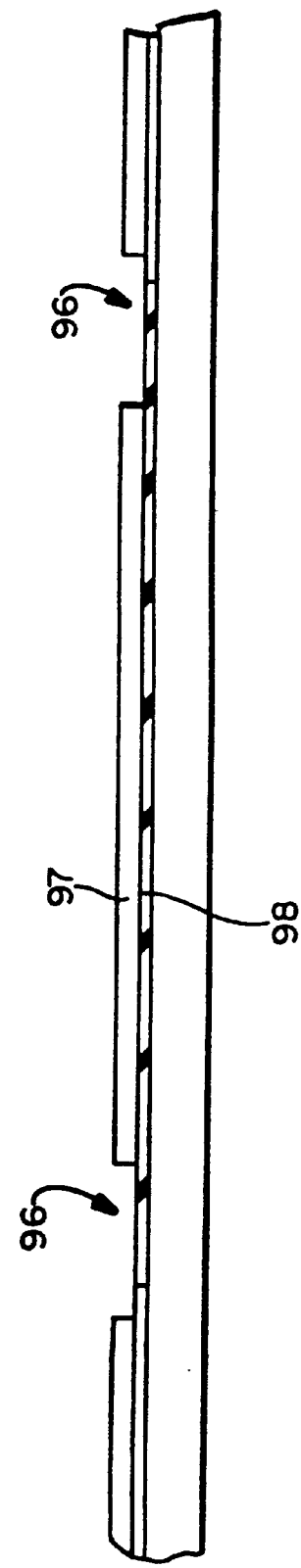

Thereafter, as shown in FIG. 2G, glass layer 91 is placed over the whole structure, and windows are cut down where contacts 90, 92, 94 are to be placed. FIG. 2H illustrates a finished NPN device as viewed topologically.

It is readily apparent to one who views the finished cross section that appears in FIG. 2G that very thin layers 34 and 32 are needed to provide the thin epi layer and the buried layer of the present device. Because an interdigitated collector having a dual collector region 72, 74 as provided, the up/down resistance between the collectors and the underlying buried layer 32 is reduced both by the presence of the thin layer 34 and the balanced collector resistance from the emitter to each of the two collectors.

Since the collector is in the same active region as the emitter, it can be physically located approximately one-half the distance from the emitter as compared with the prior art device of FIG. 1. With two collectors located one-half the distance from the emitter, the collector resistance can be reduced by about ¼, the buried layer can be much thinner (about ¼), and the isolation trenches ½ to ⅓ as deep as those of the prior art and still maintain a similar value of collector resistance. This reduces production time and costs, improves control, allows shallower structures with less parasitic collectorsubstrate capacitance (40%), and hence, higher speed performance. Similarly, if a lower collector resistance is a goal of the process, this can be reduced by about ¼ for the same process.

Putting down the N-poly of the collector and emitter permits integrating the emitter and collector into the same isolation structure. By forming the emitter and collector in the same process step and structure, with base element and contact located within a photolithographically defined space between those collector and emitter elements (separated by an oxide spacer of about 0.25 microns), the concern for mask alignment in subsequent steps is eliminated, thus allowing formation of a double collector that is approximately half the distance from the emitter and which has an overall collector-to-substrate area that is 40% smaller when compared with the prior art.

It is also readily apparent from the description above how spacers 60, 62, 64, 66 are provided between the base region 50 and the collector region 72, 74 so that although the distance from collector to base may be very small on the order of 3/10 micron, the capacitance is very low and the breakdown voltage can still be maintained at relatively high values.

An additional advantage of this structure is that the active area under the emitter is never subjected to etch (RIE) and therefore has potentially fewer defects; hence, higher yields. Prior art devices and processes put down the Poly I as a P-doped base first (P-poly first process) and opens the space between the P-poly stripe for the emitter. This reactive ion etch (RIE) exposure subjects the underlying monocrystalline silicon in the space between base regions to the etch and resulting in potential emitter damage. The present N-poly first process lays down the active emitter first and never subjects the silicon under the shallow and sensitive emitter area to either poly etch (a silicon etch) or to the RIE spacer etch (an oxide etch).

As shown by FIGS. 2E–2G, although field oxide 44 is used to surround the active device, the collector contact 54 and the emitter contact 52 are unseparated by any intervening field oxide layer. From FIG. 2H it is apparent that the collector and emitter contacts may be spaced-apart as close as 1.5 μm or less, depending upon the transistor fabrication process used. This laterally-compact structure is in contrast to that of FIG. 1, in which the collector is isolated from the rest of the device by a laterally-large intervening field oxide layer.

Other improvements of this invention are modifications of the preferred embodiment disclosed herein which will become apparent to persons skilled in the art who study the subject invention disclosure. Therefore, the scope of the invention is to be defined only by the following claims.

What is claimed:

1. A method for fabricating a bipolar transistor, comprising the following successive steps:
   (a) forming on a semiconductor substrate of P-type material a layer of N+-type material, over which layer is formed an epitaxial layer of N-type material, whereby said layer of N+-type material becomes a buried layer;
   (b) forming an isolation trench and an adjacent sinker region in the structure resulting from step (a), in which the isolation trench extends through the epitaxial layer, the buried layer, and into said substrate, and at least a peripheral portion of the sinker region provides a low resistance current path from adjacent an upper surface of said epitaxial layer to said buried layer, the region bounded by said trench defining an isolated region in which the bipolar transistor is to be fabricated;
   (c) forming a thin oxide layer on at least walls of said trench formed in step (b);
   (d) filling said trench with polysilicon;
   (e) forming an oxide layer over a surface of said substrate without forming said oxide layer over areas of said surface of said substrate in which an active portion of said bipolar transistor will be formed;
   (f) forming a P-type active base region in said epitaxial layer within said isolated region;
   (g) forming an emitter contact, and a collector contact on a structure resulting from step (f), comprising the steps of:
      (i) forming on the entire epitaxial layer a layer of polysilicon doped with N-type dopant, and forming a protective oxide layer over said polysilicon layer;
      (ii) patterning said N-type polysilicon layer and said oxide layer, said patterning defining an emitter region within said active base region and an emitter contact, said emitter contact overlying at least a portion of said active base region, and defining a separate collector contact outside said active base region, on said epitaxial layer, overlying at least a portion of said sinker region, said patterning forming vertical sidewalls in said doped polysilicon layer and said oxide layer;
   (h) depositing an oxide layer over a structure resulting from step (g) and performing an anisotropic etch on this oxide layer, thereby forming oxide sidewall spacers on said isolated region, adjoining said vertical sidewalls in said doped polysilicon layer whereby a portion of said isolated region is left exposed;
   (i) heating a structure resulting from step (h) thereby forming an emitter region and a collector contact region by diffusion of said N-type dopant from said polysilicon into said epitaxial layer thereby forming an emitter region having a depth, and thereby forming a collector contact region;
   (j) depositing a further layer of polysilicon doped with P-type dopant over said oxide layer and in contact with said exposed portion of said isolated region;
   (k) heating a structure resulting from step (j) to diffuse said P-type dopant from said further layer of polysilicon into said portion of said isolated region exposed during anisotropic etching in step (h), thereby forming an extrinsic base region adjacent said active base region;
   whereby said sidewall spacers have a lateral dimension that defines a lateral separation of said collector contact region and said extrinsic base region of said bipolar transistor and said sidewall spacers and said oxide layer provide electrical insulation between said further layer of polysilicon doped with said N-type dopant and said further layer of polysilicon doped with said P-type dopant.

2. The method of claim 1, wherein said extrinsic base has a depth that is less than a depth of said active base region.

3. The method of claim 1, wherein step (j) includes forming a layer of silicide on at least a portion of said further layer of polysilicon, whereby ohmic resistance thereon is reduced.

4. The method of claim 1, wherein step (j) includes:
   (j-1) masking a portion of said further layer of polysilicon; and
   (j-2) forming a layer of silicide on at least a portion of said further layer of silicide;
   whereby a portion of said further layer of polysilicon masked at step (j-1) has no silicide formed thereon at step (j-2) and defines a resistor.

5. The method of claim 1, wherein said buried layer has a thickness of about 1 μm, and said epitaxial layer has a thickness of about 0.75 μm.

6. The method of claim 1, wherein step (b) includes:
  (i) etching a preliminary trench extending down into said buried layer but not into said substrate;
  (ii) diffusing said preliminary trench with the N-type dopant thereby forming said N-type sinker region, said N-type sinker region extending into said buried layer and into said epitaxial layer adjacent said trench;
  (iii) etching said preliminary trench through a bottom thereof into said substrate thereby forming said trench; and
  (iv) edging said trench with oxide and filling said trench with a deposition of polysilicon that is then planarized.

7. The method of claim 1, wherein step (b) includes a preliminary step of forming a mask through which said active base region is implanted with boron.

8. The method of claim 1, wherein said bipolar transistor includes two collector contacts, and wherein step (b) includes forming a said N-type sinker region for each of said collector contacts.

9. The method of claim 1, wherein at step (g) said emitter and collector contacts are simultaneously formed on said isolated region.

10. The method of claim 1, wherein at step (g)(i), doping of said polysilicon layer is carried out in a procedure selected from a group consisting of (i) doping occurs as said polysilicon layer is formed, and (ii) doping occurs after formation of said polysilicon layer.

11. The method of claim 1, wherein step (g) includes a step of forming a silicide layer overlying the layer of N-type polysilicon formed in step (g)(i), and wherein step (g)(ii) includes a step of patterning said layer of silicide, said layer of N-type polysilicon, and said oxide layer thereby defining said emitter region and said emitter contact, and defining said separate collector contact, wherein said step of patterning forms vertical sidewalls in said silicide layer, in said doped polysilicon layer, and in said oxide layer.

12. The method of claim 11, wherein said bipolar transistor is fabricated without a field oxide layer within said expitaxial layer separating said collector contact and base region.

13. The method of claim 1, wherein at step (h), said sidewall spacers have a lateral dimension of about 0.25 μm.

14. A method for fabricating a bipolar transistor without a field oxide layer within the expitaxial layer separating the collector contact and base region, comprising the following successive steps:
  (a) forming on a semiconductor substrate of P-type material a layer of N+-type material, over which layer is formed an epitaxial layer of N-type material, whereby said layer of N+-type material becomes a buried layer;
  (b) forming an isolation trench and an adjoining N-type sinker region in the structure resulting from step (a), in which the isolation trench extends through the epitaxial layer, the buried layer, and into said substrate, and at least a peripheral portion of the sinker region provides a low resistance current path from adjacent an upper surface of said epitaxial layer to said buried layer, the region bounded by said trench defining an isolated region in which the bipolar transistor is to be fabricated;
  (c) forming a thin oxide layer edging walls of said trench formed in step (b);
  (d) filling said trench with polysilicon;
  (e) forming an oxide layer over a surface of said substrate without forming said oxide layer over areas of said surface of said substrate in which an active portion of said bipolar transistor will be formed;
  (f) forming a P-type active base region in said epitaxial layer within said isolated region;
  (g) forming an emitter contact, and a collector contact on a structure resulting from step (f), comprising the steps of:
    (i) forming on the entire epitaxial layer a layer of polysilicon doped with N-type dopant, and forming a protective oxide layer over said polysilicon layer;
    (ii) patterning said N-type polysilicon layer and said oxide layer, said patterning defining an emitter region within said active base region and an emitter contact, said emitter contact overlying at least a portion of said active base region, and defining a separate collector contact outside said active base region, on said epitaxial layer, overlying at least a portion of said sinker region, said patterning forming vertical sidewalls in said doped polysilicon layer and said oxide layer;
  (h) depositing an oxide layer over a structure resulting from step (g) and performing an anisotropic etch on this oxide layer, thereby forming oxide sidewall spacers on said isolated region adjoining said vertical sidewalls in said doped polysilicon layer whereby a portion of said isolated region is left exposed;
  (i) heating a structure resulting from step (h) thereby forming an emitter region and a collector contact region by diffusion of said N-type dopant from said polysilicon into said epitaxial layer thereby forming an emitter region having a depth, and thereby forming a collector contact region;
  (j) depositing a further layer of polysilicon doped with P-type dopant over said oxide layer and in contact with said exposed portion of said isolated region;
  (k) heating a structure resulting from step (j) to diffuse said P-type dopant from said further layer of polysilicon into said portion of said isolated region exposed during anisotropic etching in step (h), thereby forming an extrinsic base region adjacent said active base region;
  whereby said sidewall spacers have a lateral dimension that defines a lateral separation of said collector contact region and said extrinsic base region of said bipolar transistor and said sidewall spacers and said oxide layer provide electrical insulation between said further layer of polysilicon doped with said N-type dopant and said further layer of polysilicon doped with said P-type dopant.

15. The method of claim 14, wherein said extrinsic base has a depth that is less than a depth of said active base region.

16. The method of claim 14, wherein step (j) includes forming a layer of silicide on at least a portion of said further layer of polysilicon, whereby ohmic resistance thereon is reduced.

17. The method of claim 14, wherein step (j) includes:
  (j-1) masking a portion of said further layer of polysilicon; and
  (j-2) forming a layer of silicide on at least a portion of said further layer of silicide;
  whereby a portion of said further layer of polysilicon masked at step (j-1) has no silicide formed thereon at step (j-2) and defines a resistor.

18. The method of claim 14, wherein said buried layer has a thickness of about 1 μm, and said epitaxial layer has a thickness of about 0.75 μm.

19. The method of claim 14, wherein step (b) includes:
   (i) etching a preliminary trench extending down into said buried layer but not into said substrate;
   (ii) diffusing said preliminary trench with the N-type dopant thereby forming said N-type sinker region, said N-type sinker region extending into said buried layer and into said epitaxial layer adjacent said trench;
   (iii) etching said preliminary trench through a bottom thereof into said substrate thereby forming said trench; and
   (iv) edging said trench with oxide and filling said trench with a deposition of polysilicon that is then planarized.

20. The method of claim 14, wherein step (b) includes a preliminary step of forming a mask through which said active base region is implanted with boron.

21. The method of claim 14, wherein said bipolar transistor includes two collector contacts, and wherein step (b) includes forming a said N-type sinker region for each of said collector contacts.

22. The method of claim 14, wherein at step (g) said emitter and collector contacts are simultaneously formed on said isolated region.

23. The method of claim 14, wherein at step (g)(i), doping of said polysilicon layer is carried out in a procedure selected from a group consisting of (i) doping occurs as said polysilicon layer is formed, and (ii) doping occurs after formation of said polysilicon layer.

24. The method of claim 14, wherein step (g) includes a step of forming a silicide layer overlying the layer of N-type polysilicon formed in step (g)(i), and wherein step (g)(ii) includes a step of patterning said layer of silicide, said layer of N-type polysilicon, and said oxide layer thereby defining said emitter region and said emitter contact, and defining said separate collector contact, wherein said step of patterning forms vertical sidewalls in said silicide layer, in said doped polysilicon layer, and in said oxide layer.

25. The method of claim 14, wherein at step (h), said sidewall spacers have a lateral dimension of about 0.25 μm.

* * * * *